(12) United States Patent
Choi et al.

(10) Patent No.: US 9,391,292 B2
(45) Date of Patent: Jul. 12, 2016

(54) DISPLAY DEVICE, METHOD OF MANUFACTURING THE SAME, AND METHOD OF REPAIRING THE SAME

(71) Applicant: SAMSUNG DISPLAY CO., LTD., Yongin, Gyeonggi-Do (KR)

(72) Inventors: Bo-Kyung Choi, Seongnam-si (KR); Yun-Mo Chung, Yongin-si (KR); Jong-Ryuk Park, Cheonan-si (KR); Jinwook Seo, Seoul (KR); Dong-Hyun Lee, Suwon-si (KR)

(73) Assignee: Samaung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/505,391

(22) Filed: Oct. 2, 2014

(65) Prior Publication Data
US 2015/0280169 A1    Oct. 1, 2015

(30) Foreign Application Priority Data
Mar. 25, 2014  (KR) ........................ 10-2014-0034870

(51) Int. Cl.
*H01L 51/56*  (2006.01)
*H01L 51/52*  (2006.01)
*H01L 27/32*  (2006.01)

(52) U.S. Cl.
CPC ........ *H01L 51/5237* (2013.01); *H01L 27/3258* (2013.01); *H01L 51/5209* (2013.01); *H01L 27/3244* (2013.01)

(58) Field of Classification Search
CPC ..... H01L 21/84; H01L 27/28; H01L 27/3244; H01L 27/3272; H01L 29/786; H01L 33/62; H01L 35/24; H01L 51/56; H01L 51/5237
See application file for complete search history.

(56) References Cited

U.S. PATENT DOCUMENTS

2007/0195248 A1*  8/2007  Huh .................... G02F 1/13624
                                                        349/139
2012/0091439 A1   4/2012  Nishiyama et al.

FOREIGN PATENT DOCUMENTS

| JP | 2009-170395 | 7/2009 |
|----|-------------|--------|
| KR | 10-2009-0002742 | 1/2009 |
| KR | 10-1022156 | 3/2011 |
| KR | 10-1294269 | 8/2013 |

OTHER PUBLICATIONS

Korean Patent Abstracts Publication No. KR 10-2010-0093220 A, dated Aug. 25, 2010, for KR 10-1022156, 1 page.
Korean Patent Abstracts Publication No. KR 10-2007-0113070 A, dated Nov. 28, 2007, for KR 10-1294269, 1 page.

\* cited by examiner

*Primary Examiner* — Kyoung Lee
(74) *Attorney, Agent, or Firm* — Lewis Roca Rothgerber Christie LLP

(57) ABSTRACT

A display device includes a substrate, a passivation layer on the substrate and including an area having a first thickness and an area having a second thickness less than the first thickness, a first electrode on the passivation layer and including at least two sub-electrodes spaced apart from each other by a slit having two ends, a light emitting layer on the first electrode, and a second electrode on the light emitting layer. Both ends of the slit are in one the area of the passivation layer having the second thickness.

20 Claims, 13 Drawing Sheets

DISPLAY DEVICE, METHOD OF MANUFACTURING THE SAME, AND METHOD OF REPAIRING THE SAME

CROSS-REFERENCE TO RELATED APPLICATION

This application claims priority to and the benefit of Korean Patent Application No. 10-2014-0034870, filed on Mar. 25, 2014 with the Korean Patent Office, the entire contents of which are hereby incorporated by reference.

BACKGROUND

1. Field

Aspects of the present invention relate to a display device, a method of manufacturing the display device, and a method of repairing the display device.

2. Description of the Related Art

Flat display devices are classified into light-emitting type and light-receiving type flat display devices. Light-emitting type flat display devices include flat cathode ray tubes, plasma display panels, and electroluminescent devices, while light-receiving type flat display devices include liquid crystal displays. Among these flat display devices, electroluminescent devices have garnered much attention due to their various advantages, such as wide viewing angles, superior contrast ratios, fast response times, etc. These electroluminescent devices are further classified into inorganic electroluminescent devices and organic electroluminescent devices.

The organic electroluminescent devices are self-emissive display devices that electrically excite a luminous organic substance to emit light, resulting in a display device with low driving voltages, smaller thicknesses, wide viewing angles, fast response times, etc., which are drawbacks of liquid crystal displays.

These organic electroluminescent devices generally include an anode electrode, a cathode electrode, and a light emitting layer between the anode electrode and the cathode electrode. In these organic electroluminescent devices, when positive and negative voltages are applied to the anode electrode and the cathode electrode, respectively, holes are injected into the light emitting layer through a hole transport layer, and electrons are injected into the light emitting layer through an electron transport layer. Then, the holes and the electrons are recombined in the light emitting layer to generate excitons. The excitons emit energy discharged as light when the exciton returns from an excited state to a ground state.

SUMMARY

Aspects of the present invention are directed toward a display device, a method of manufacturing the display device, and a method of repairing the display device, particularly a display device capable of preventing a short-circuit.

According to aspects of the present invention, a display device includes a substrate, a passivation layer on the substrate, the passivation layer including an area having a first thickness and an area having a second thickness less than the first thickness, a first electrode on the passivation layer and including at least two sub-electrodes spaced apart from each other by a slit having two ends, a light emitting layer on the first electrode, and a second electrode on the light emitting layer. Both ends of the slit are in the area of the passivation layer having the second thickness.

The area having the first thickness may be in a first area, and the area having the second thickness less than the first thickness may be in a second area of the passivation layer. The passivation layer may define an opening in a third area, and both ends of the slit may overlap the second area.

The substrate may include a display area in which an image is configured to be displayed, and a non-display area surrounding the display area, in which no image is displayed. The third area of the passivation layer may overlap the display area.

The second area may have a quadrangular shape and one side of the quadrangular shape of the second area may match a portion of one of the sides of the third area.

The passivation layer may include an organic insulating material or an inorganic insulating material.

The passivation layer may have a multi-layer structure.

The display device may further include a thin film transistor between the substrate and the passivation layer to apply an image signal to each of the sub-electrodes.

At least one of the sub-electrodes may be disconnected from the thin film transistor.

According to additional aspects of the present invention, a method of manufacturing a display device includes forming a passivation layer having a first area with a first thickness and a second area with a second thickness less than the first thickness on a substrate, forming a first electrode on the passivation layer, the first electrode having a plurality of sub-electrodes spaced apart from each other by a slit having two ends, forming a light emitting layer on the first electrode, and forming a second electrode on the organic light emitting layer. Both ends of the slit are in the second area of the passivation layer.

The forming of the passivation layer may include forming an insulating layer on the substrate, and patterning the insulating layer to have the first thickness in the first area, the second thickness in the second area, and an opening in a third area.

Both ends of the slit may overlap the second area.

The patterning of the insulating layer may include forming a photosensitive organic material on the substrate, positioning a mask on the photosensitive organic material, exposing the photosensitive organic material through the mask, and developing the photosensitive organic material.

The mask may be a halftone mask or a diffraction mask.

The photosensitive organic material may be a positive type or a negative type photoresist.

The photosensitive organic material may be a positive type photoresist, and the mask may block a light traveling to the photosensitive organic material in the first area, may transmit a portion of the light and block the remaining portion of the light in the second area, and may transmit the light in the third area.

The substrate may include a display area in which an image is configured to be displayed and a non-display area surrounding the display area, in which no image is displayed. The third area may overlap the display area.

The second area may have a quadrangular shape and one side of the quadrangular shape of the second area may match a portion of one of the sides of the third area.

The method may further include forming a thin film transistor on the substrate before forming the passivation layer.

According to additional aspects of the present invention, a method for repairing a display device includes checking a sub-electrode in which a defect has occurred, and disconnecting the sub-electrode in which the defect has occurred from a thin film transistor of the display device. The display device includes a substrate, the thin film transistor on the substrate, a passivation layer on the thin film transistor, a first electrode on the passivation layer and having at least two sub-electrodes spaced apart from each other, a light emitting layer on the first electrode, and a second electrode on the light emitting layer.

The sub-electrode in which the defect occurs may be disconnected from the thin film transistor by a laser beam.

According to aspects of the present invention, a first electrode of the display device may include sub-electrodes such that a whole pixel may be prevented from malfunctioning even when a defect occurs in a portion of the first electrode. Thus, when a defect occurs in one of the sub-electrodes of the display device, the pixel may be normally driven by the remaining sub-electrodes of the first electrode after the sub-electrode in which the defect occurs is disconnected.

According to additional aspects of the present invention, since a passivation layer of the display device may have a relatively small thickness in an area adjacent to where sub-pixels of a first electrode of the display device are positioned adjacent to each other, the sub-pixels may be prevented from being disconnected from each other.

BRIEF DESCRIPTION OF THE DRAWINGS

The above and other aspects of the present invention will become more readily apparent by reference to the following detailed description when considered in conjunction with the accompanying drawings, wherein.

DETAILED DESCRIPTION

Figure 1:
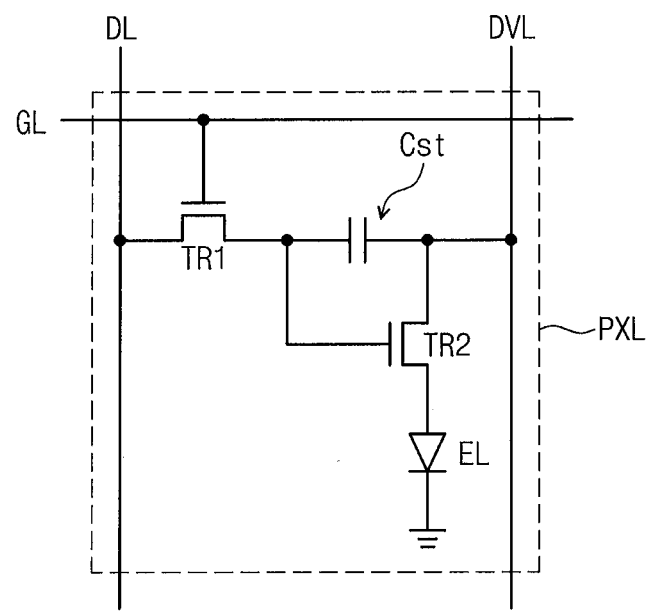
FIG. 1 is a circuit diagram showing a display device according to an embodiment of the present invention.

It will be understood that when an element or layer is referred to as being "on", "connected to," or "coupled to" another element or layer, it can be directly on, connected to, or coupled to the other element or layer, or intervening elements or layers may also be present. In contrast, when an element is referred to as being "directly on," "directly connected to," or "directly coupled to" another element or layer, there are no intervening elements or layers present. Like numbers refer to like elements throughout. As used herein, the term "and/or" includes any and all combinations of one or more of the associated listed items.

It will be understood that although the terms first, second, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. Thus, for example, a first element, component, region, layer, or section discussed below could be termed a second element, component, region, layer, or section without departing from the teachings of the present invention.

Spatially relative terms, such as "beneath," "below," "lower," "above," "upper," and the like, may be used herein for ease of description to describe the relationship between one element or feature to another element(s) or feature(s) as illustrated in the figures. It will be understood that these spatially relative terms are intended to encompass different orientations of the device in use or operation in addition to the orientation depicted in the figures. For example, if the device in the figures is turned over, elements described as "below" or "beneath" other elements or features might then be oriented "above" the other elements or features. Thus, the term "below" can encompass both an orientation of above and below. The device may be otherwise oriented (rotated 90 degrees or at other orientations) and, thus, the spatially relative descriptors used herein interpreted accordingly.

The terminology used herein is for the purpose of describing particular embodiments only, and is not intended to be limiting. As used herein, the singular forms, "a," "an," and "the" are intended to include the plural forms as well, unless the context clearly indicates otherwise. It will be further understood that the terms "comprises," "includes," and/or "including," as used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art, and these terms should not be interpreted in an idealized or overly formal sense, unless expressly so defined herein.

Hereinafter, embodiments of the present invention will be explained in detail with reference to the accompanying drawings.

Figure 2:
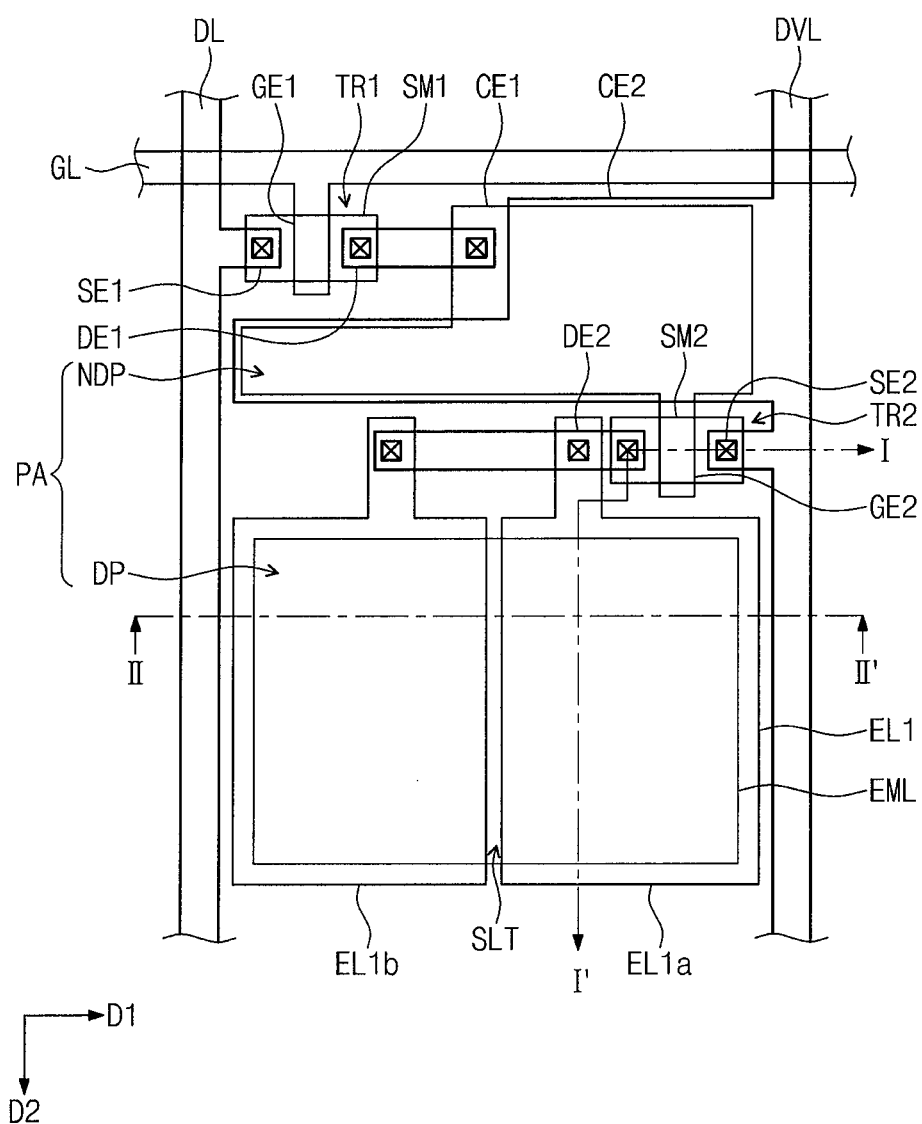
FIG. 2 is a plan view showing a pixel of the display device shown in FIG. 1.
Figure 3A:
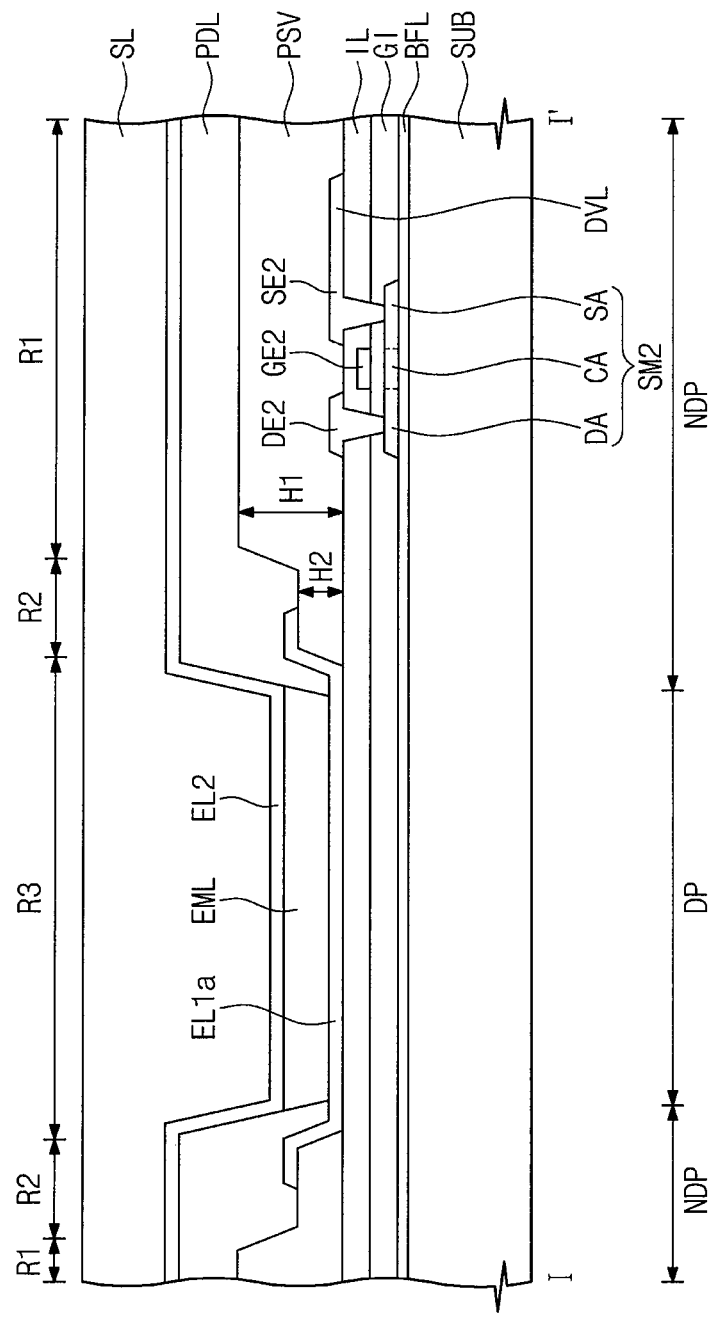
FIG. 3A is a cross-sectional view of the pixel taken along the line I-I' shown in FIG. 2.
Figure 3B:
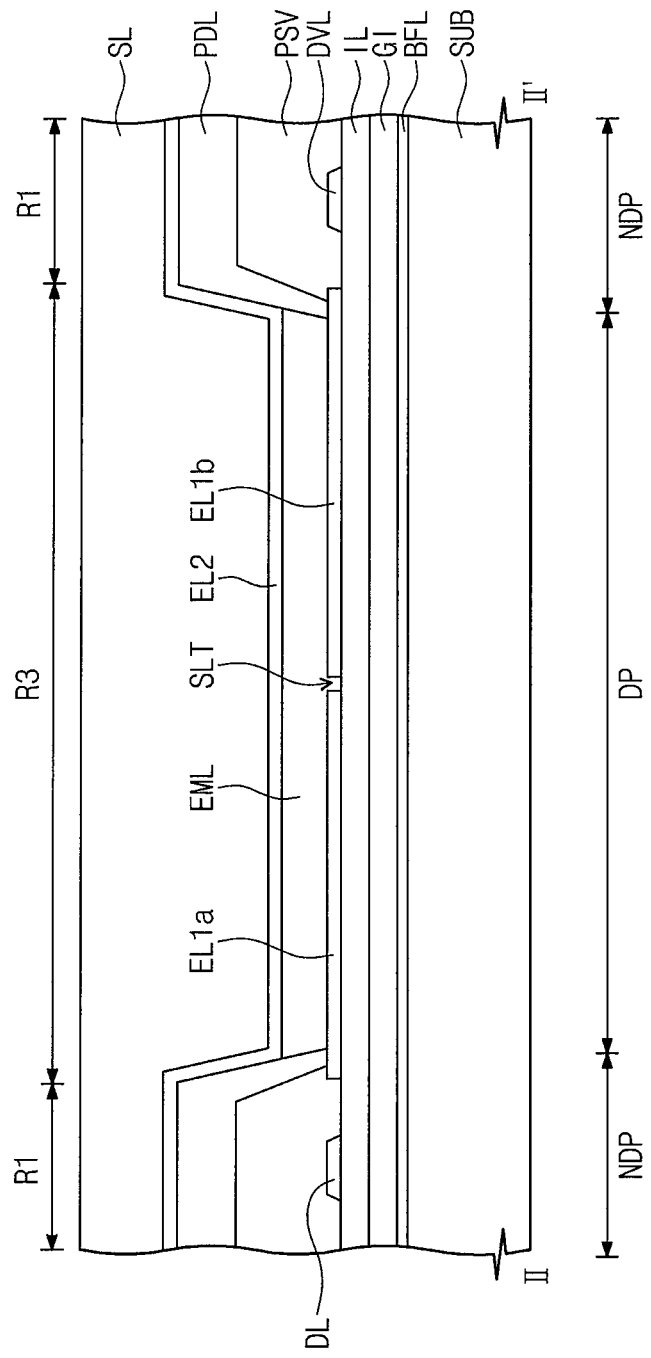
FIG. 3B is a cross-sectional view of the pixel taken along the line II-II' shown in FIG. 2.

FIG. 1 is a circuit diagram showing a display device according to an embodiment of the present invention, FIG. 2 is a plan view showing a pixel of the display device shown in FIG. 1, FIG. 3A is a cross-sectional view of the pixel taken along the line I-I' shown in FIG. 2, and FIG. 3B is a cross-sectional view of the pixel taken along the line II-II' shown in FIG. 2.

The display device, according to embodiments of the present invention, will be described in further detail with reference to FIGS. 1, 2, 3A, and 3B.

The display device, according to an embodiment, includes at least one pixel PXL to display an image. The display device may include a plurality of pixels PXL, which may be arranged, for example, in matrix form. For convenience of explanation, only one pixel PXL will be described in detail in the present embodiment. According to this embodiment, the pixel PXL is located in an area referred to as a pixel area PA. In an embodiment, the pixel area PA has a rectangular shape, but is not be limited to this rectangular shape. The pixel area PA may have a size different from that of an adjacent pixel area. For example, the pixel areas PA for pixels PXL having different colors may have different sizes or different shapes. The pixel area PA, according to an embodiment, includes a display area DP in which an image is displayed, and a non-display area NDP in which no image is displayed. The non-display area NDP, in this embodiment, is adjacent to at least one side of the display area DP or may surround the display area DP.

The pixel PXL, according to an embodiment, includes a line part including a gate line GL, a data line DL, and a driving voltage line DVL; a thin film transistor connected or coupled to the line part; an organic light emitting device EL connected or coupled to the thin film transistor; and a capacitor Cst.

The gate line GL, according to an embodiment, extends in a first direction D1, and the data line DL, according to this embodiment, extends in a second direction D2 crossing the gate line GL. The driving voltage line DVL, according to this embodiment, extends in the second direction D2, similar to the data line DL. In this embodiment, the gate line GL applies a scan signal to the thin film transistor, the data line DL applies a data signal to the thin film transistor, and the driving voltage line DVL applies a driving voltage to the thin film transistor.

The thin film transistor, according to an embodiment, includes a driving thin film transistor TR2 to control the organic light emitting device EL, and a switching thin film transistor TR1 to switch the driving thin film transistor TR2. In this embodiment, one pixel PXL includes two thin film transistors TR1 and TR2, but the number of the thin film transistors is not limited to two. Thus, for example, one pixel PXL may include one thin film transistor TR1 or TR2 and a capacitor Cst, or three or more thin film transistors TR1, TR2, etc., and two or more capacitors Cst.

The switching thin film transistor TR1, according to an embodiment, includes a first gate electrode GE1, a first source electrode SE1, and a first drain electrode DE1. The first gate electrode GE1, in an embodiment, is connected or coupled to the gate line GL and the first source electrode SE1, in this embodiment, is connected or coupled to the data line DL. The first drain electrode DE1, in this embodiment, is connected or coupled to a gate electrode (hereinafter, referred to as a second gate electrode GE2) of the driving thin film transistor TR2. According to an embodiment, the switching thin film transistor TR1 applies a data signal provided through the data line DL to the driving thin film transistor TR2 in response to a scan signal provided through the gate line GL.

The driving thin film transistor TR2, according to an embodiment, includes the second gate electrode GE2, a second source electrode SE2, and a second drain electrode DE2. The second gate electrode GE2, according to an embodiment, is connected or coupled to the switching thin film transistor TR1, the second source electrode SE2 is connected or coupled to the driving voltage line DVL, and the second drain electrode DE2 is connected or coupled to the organic light emitting device EL.

The organic light emitting device EL, according to an embodiment, includes a light emitting layer EML, a first electrode EL1, and a second electrode EL2 facing the first electrode EL1 such that the light emitting layer EML is between the first and second electrodes EL1 and EL2. The light emitting layer EML, in an embodiment, is in the display area DP of the pixel area PA.

The first electrode EL1, according to an embodiment, is connected or coupled to the second drain electrode DE2 of the driving thin film transistor TR2.

The first electrode EL1, in an embodiment, has an area greater than that of the display area DP and extends over the display area DP. In this embodiment, the display area DP is inside the first electrode EL1 and an edge of the first electrode EL1 does not overlap with the display area DP when viewed in a plan view.

The first electrode EL1, according to an embodiment, includes a slit SLT defined therethrough, and thus dividing the first electrode EL1 into two sub-electrodes spaced apart from each other by the slit SLT extending in one direction. In this embodiment, the first electrode EL1 includes a first sub-electrode EL1a and a second sub-electrode EL1b, which are divided by the slit SLT extending in the second direction D2.

According to another embodiment, the first electrode EL1 may include a plurality of slits SLT defined therethrough. In this embodiment, the first electrode EL1 includes three or more sub-electrodes spaced apart from each other. For example, the first electrode EU may include first, second, third, and fourth sub-electrodes defined by the slits SLT extending in the first and second directions D1 and D2.

The sub-electrodes EL1a and EL1b, for example, are connected or coupled to the second drain electrode DE2 of the driving thin film transistor TR2 through connection portions, according to an embodiment. In an embodiment, the sub-electrodes EL1a and EL1b, for example, adjacent to each other are connected or coupled to each other, and one of the sub-electrodes EL1a or EL1b is connected or coupled to the second drain electrode DE2 of the driving thin film transistor TR2.

The second electrode EL2, according to an embodiment, receives a common voltage and the light emitting layer EML emits light in response to an output signal from the driving thin film transistor TR2, resulting in an image being displayed.

The capacitor Cst, according to an embodiment, is connected or coupled between the second gate electrode GE2 of the driving thin film transistor TR2 and the second source electrode SE2 of the driving thin film transistor TR2. The capacitor Cst, in this embodiment, is charged with the data signal applied to the second gate electrode GE2 of the driving thin film transistor TR2.

Hereinafter, the display device according to embodiments of the present invention will be described in further detail according to an order of stacking of elements or components of the display device.

The display device, according to an embodiment, includes an insulating substrate SUB, e.g., glass, plastic, crystal, etc., and the thin film transistor and the organic light emitting device EL may be on the insulating substrate.

According to an embodiment, a buffer layer BFL is on the substrate SUB. The buffer layer BFL prevents foreign substances from entering the switching and driving thin film transistors TR1 and TR2. The buffer layer BFL, according to an embodiment, is formed of silicon nitride (SiNx), silicon oxide (SiOx), or silicon oxy-nitride (SiOxNy) and may be an optional layer of the display device depending on the material and process conditions of the substrate SUB.

According to an embodiment, a first semiconductor layer SM1 and a second semiconductor layer SM2 are on the buffer layer BFL (or the substrate SUB where the buffer layer BFL is omitted). The first and second semiconductor layers SM1 and SM2, according to this embodiment, are formed of a semiconductor material and serve as active layers of the switching thin film transistor TR1 and the driving thin film transistor TR2, respectively. Each of the first and second semiconductor layers SM1 and SM2, according to an embodiment, includes a source area SA, a drain area DA, and a channel area CA between the source area SA and the drain area DA. Each of the first and second semiconductor layers SM1 and SM2, according to an embodiment, is formed of an inorganic semiconductor material or an organic semiconductor material. For example, the first and second semiconductor layers SM1 and SM2 may include an oxide semiconductor material, an amorphous silicon semiconductor material, or a crystalline or polycrystalline silicon semiconductor material. The oxide semiconductor material, according to an embodiment, includes an oxide material containing at least one of indium (In), gallium (Ga), zinc (Zn), and tin (Sn). In an embodiment, the first and second semiconductor layers SM1 and SM2 include an oxide semiconductor material, e.g., zinc oxide, tin oxide, indium oxide, indium-zinc (In—Zn) oxide, indium-tin (In—Sn) oxide, indium-gallium-zinc (In—Ga—Zn) oxide, indium-zinc-tin (In—Zn—Sn) oxide, indium-gallium-zinc-tin (In—Ga—Zn—Sn) oxide, etc. The source area SA and the drain area DA, in an embodiment, are doped with n or p-type impurities.

According to an embodiment, a gate insulating layer GI is on the first and second semiconductor layers SM1 and SM2.

The first and second gate electrodes GE1 and GE2, which are connected or coupled to the gate line GL, are on the gate insulating layer GI, according to an embodiment. The first and second gate electrodes GE1 and GE2 extend over to cover the channel area CA of the first and second semiconductor layers SM1 and SM2, respectively, according to an embodiment.

According to an embodiment, an inter-insulating layer IL is on the first and second gate electrodes GE1 and GE2 and extends over to cover the first and second gate electrodes GE1 and GE2.

The first source electrode SE1, the first drain electrode DE1, the second source electrode SE2, and the second drain electrode DE2, according to an embodiment, are on the inter-insulating layer IL. In an embodiment, the first source electrode SE1 and the first drain electrode DE1 contact the source area SA and the drain electrode DA, respectively, of the first semiconductor layer SM1 through contact holes defined in the gate insulating layer GI and the inter-insulating layer IL. According to an embodiment, the second source electrode SE2 and the second drain electrode DE2 contact the source area SA and the drain electrode DA, respectively, of the second semiconductor layer SM2 through contact holes defined in the gate insulating layer GI and the inter-insulating layer IL.

In an embodiment, a portion of the second gate electrode GE and a portion of the driving voltage line DVL serve as a first capacitor electrode CE1 and a second capacitor electrode CE2, respectively, and together with the inter-insulating layer IL between form the capacitor Cst.

According to an embodiment, a passivation layer PSV is on the first source electrode SE1, the first drain electrode DE1, the second source electrode SE2, the second drain electrode DE2, and the inter-insulating layer IL. The passivation layer PSV, in this embodiment, protects the switching thin film transistor TR1 and the driving thin film transistor TR2, and prevents foreign substances from being diffused to the channel areas of the switching thin film transistor TR1 and the driving thin film transistor TR2. In addition, the passivation layer PSV planarizes an upper surface of the substrate SUB, according to an embodiment.

In an embodiment, the passivation layer PSV includes an organic insulating material, for example, an organic polymer. According to another embodiment, the passivation layer PSV may include an organic polymer, e.g., silicon nitride (SiNx), silicon oxide (SiOx), silicon oxy-nitride (SiOxNy), etc.

In an embodiment, the passivation layer PSV may have a single-layer structure or a multi-layer structure. For example, the passivation layer PSV may have a double-layer structure with a lower layer including the inorganic polymer and an upper layer including the organic polymer, or a triple-layer structure with a lower layer including the inorganic polymer, an intermediate layer including the organic polymer, and an upper layer including the inorganic polymer.

The passivation layer PSV, according to an embodiment, defines a thru-hole to expose a portion of an upper surface of the second drain electrode DE2 of the driving thin film transistor TR2.

The passivation layer PSV, according to an embodiment, includes an opening corresponding to the display area DP such that the passivation layer PSV does not extend into the display area DP. The passivation layer PSV, in this embodiment, is in the non-display area NDP. The passivation layer PSV, according to this embodiment, has varying different thicknesses depending on its position in the non-display area NDP, when viewed in a plan view. In an embodiment, the passivation layer PSV has a relatively small thickness in an area adjacent to both ends of the slit SLT that divides the first electrode EL1 into the sub-electrodes and overlaps with portions of both ends of the slit SLT. In this embodiment, where the non-display area NDP, except for the area adjacent to the both ends of the slit SLT, is referred to as a first area R1, and where the area adjacent to the both ends of the slit SLT and partially overlapping both ends of the slit SLT is referred to as a second area R2, and the passivation layer PSV has a first thickness H1 in the first area R1 and a second thickness H2 in the second area R2, the first thickness H1 being greater than the second thickness H2. In an embodiment where the display area DP is referred to as a third area R3, the passivation layer PSV does not extend into the third area R3.

The first electrode EL1 is on the passivation layer PSV, according to an embodiment.

The first electrode EL1 is connected or coupled to the second drain electrode DE2 of the driving thin film transistor TR2 through the thru-hole defined in the passivation layer PSV, according to an embodiment.

Hereinafter, the first electrode EL1 will be described as the anode, but should not be limited thereto.

The first electrode EL1, in an embodiment, includes a material with a high work function and is formed of a transparent conductive layer, e.g., indium tin oxide, indium zinc oxide, zinc oxide, indium tin zinc oxide, etc., when the image is displayed toward a lower direction of the substrate SUB in the figures.

When the image is displayed toward an upper direction of the substrate SUB in the figures, the first electrode EL1 includes a metal reflection layer, e.g., Ag, Mg, Al, Pt, Pd, Au, Ni, Nd, Ir, Cr, etc., and the transparent conductive layer including, e.g., indium tin oxide, indium zinc oxide, zinc oxide, indium tin zinc oxide, etc.

The first electrode EL1 extends to cover the display area DP and a portion of the non-display area NDP surrounding the display area DP, in an embodiment. In this embodiment, an edge of the first electrode EL1 passes through the second area R2. More particularly, an end of the slit SLT that divides the first electrodes EL1 into the sub-electrodes EL1a and EL1b passes through the second area R2. In this embodiment, since the first sub-electrode EL1a and the second sub-electrode EL1b are defined by the slit SLT extending in the second direction D2, the second area R2 is adjacent to both ends of the slit SLT and partially overlaps the first and second sub-electrodes EL1a and EL1b. In addition, in this embodiment where the first and second sub-electrodes EL1a and EL1b are adjacent to each other to form a quadrangular shape, vertexes at both ends of sides of the first and second sub-electrodes EL1a and EL1b facing each other are in the second area R2.

According to an embodiment, a pixel definition layer PDL is on the substrate SUB to partition the display areas DA corresponding to respective pixels PXL. The pixel definition layer PDL, in this embodiment, is in the non-display area NDP and does not extend into the display area DP in each pixel PXL. The pixel definition layer PDL, in this embodiment, exposes an upper surface of the first electrode EL1 and protrudes or extends from the substrate SUB along a circumference or perimeter of the first electrode EL1.

The light emitting layer EML, in an embodiment, is in the display area DP surrounded by the pixel definition layer PDL and the second electrode EL2, in this embodiment, is on the light emitting layer EML.

In an embodiment, the light emitting layer EML includes a luminous material to emit red, green, and blue lights corresponding to the pixels PXL. In this embodiment, the pixels PXL that emit the red, green, and blue lights become red, green, and blue pixels PXL, respectively, corresponding to red, green, and blue pixel areas PA. One red pixel PXL, one green pixel PXL, and one blue pixel PXL form a main pixel PXL, according to an embodiment. However, the color of the light emitted from the pixel PXL should not be limited thereto. Thus, for example, the pixel PXL may further emit yellow or magenta light in addition to the red, green, and blue lights, or the pixel PXL may emit a white light.

In an embodiment, the light emitting layer EML may have a single-layer structure or a multi-layer structure. For example, the light emitting layer EML may include a hole injection layer, a hole transport layer, an organic light emitting layer, an electron transport layer, and an electron injection layer, which are sequentially stacked on the first electrode EL1, or at least one of the hole injection layer, the hole transport layer, the electron transport layer, and the electron injection layer may be omitted.

The second electrode EL2, according to an embodiment, includes a material with a low work function, e.g., a metal, an alloy, an electrical conductive compound, or a mixture thereof. In this embodiment, the second electrode EL2 may include a lithium (Li), magnesium (Mg), aluminum (Al), aluminum-lithium (Al—Li), calcium (Ca), magnesium-indium (Mg—In), magnesium-silver (Mg—Ag), etc., material. In an embodiment, the second electrode EL2 may be a transparent electrode or a reflective electrode. In an embodiment where the second electrode EL2 is a transparent electrode, the second electrode EL2 includes the transparent conductive material, and in an embodiment where the second electrode EL2 is a reflective electrode, the second electrode EL2 includes the metal reflection layer.

According to an embodiment, a sealing layer SL is on the second electrode EL2 extending to cover the second electrode EL2.

In the display device according to an embodiment having the above-mentioned structure, the first electrode EL1 includes the sub-electrodes EL1a and EL1b, thus preventing or reducing the likelihood that the whole pixel PXL may malfunction, even though defects may occur in the first electrode EL1. Thus, when defects occur in one of the sub-electrodes EL1a or EL1b, according to these embodiments, the pixel PXL may be normally driven by the other of the sub-electrodes, e.g., EL1b or EL1a, after the sub-electrode, e.g., EL1a or EL1b, in which defects occur, is disconnected.

In addition, since the passivation layer PSV, according to these embodiments, has a relatively small thickness H2 in the area R2 adjacent to the area R3 in which the sub-pixels EL1a and EL1b are located adjacent to each other, the sub-pixels EL1a or EL1b may be prevented from being disconnected from each other, as will be described in greater detail, below.

FIGS. 4A through 4E are cross-sectional views showing a method of manufacturing a display device according to an embodiment of the present invention. For convenience of explanation, some elements of the display device described in detail and shown in the other figures have been omitted in FIGS. 4A to 4E.

Figure 4A:
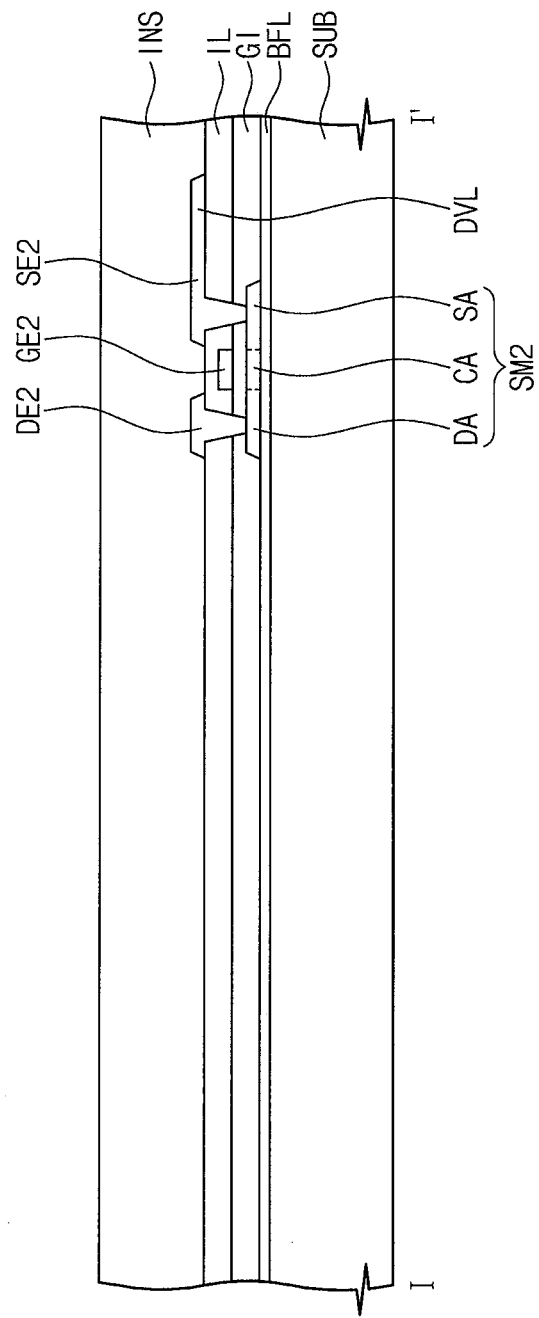
FIGS. 4A through 4E are cross-sectional views showing a method of manufacturing a display device according to an embodiment of the present invention.

Referring to the embodiment illustrated in FIG. 4A, the line part, the switching thin film transistor, and the driving thin film transistor of the display device are formed on the substrate SUB. FIG. 4A shows the second gate electrode GE2, the second semiconductor layer SM2, the second source electrode SE2, and the second drain electrode DE2 of the driving thin film transistor.

An insulating layer INS, according to an embodiment, is formed on the switching and driving thin film transistors. The insulating layer INS, in this embodiment, is used to form the passivation layer PSV and includes an organic insulating material or an inorganic insulating material.

In an embodiment, the passivation layer PSV is formed using an organic insulating material, i.e., photosensitive organic material.

In an embodiment where the passivation layer PSV is formed using photosensitive material, the passivation layer PSV may be easily patterned by an exposure and development process. The passivation layer PSV, in this embodiment, may be coated on elements including the thin film transistor or may be formed by an inkjet method, for example.

Figure 4B:
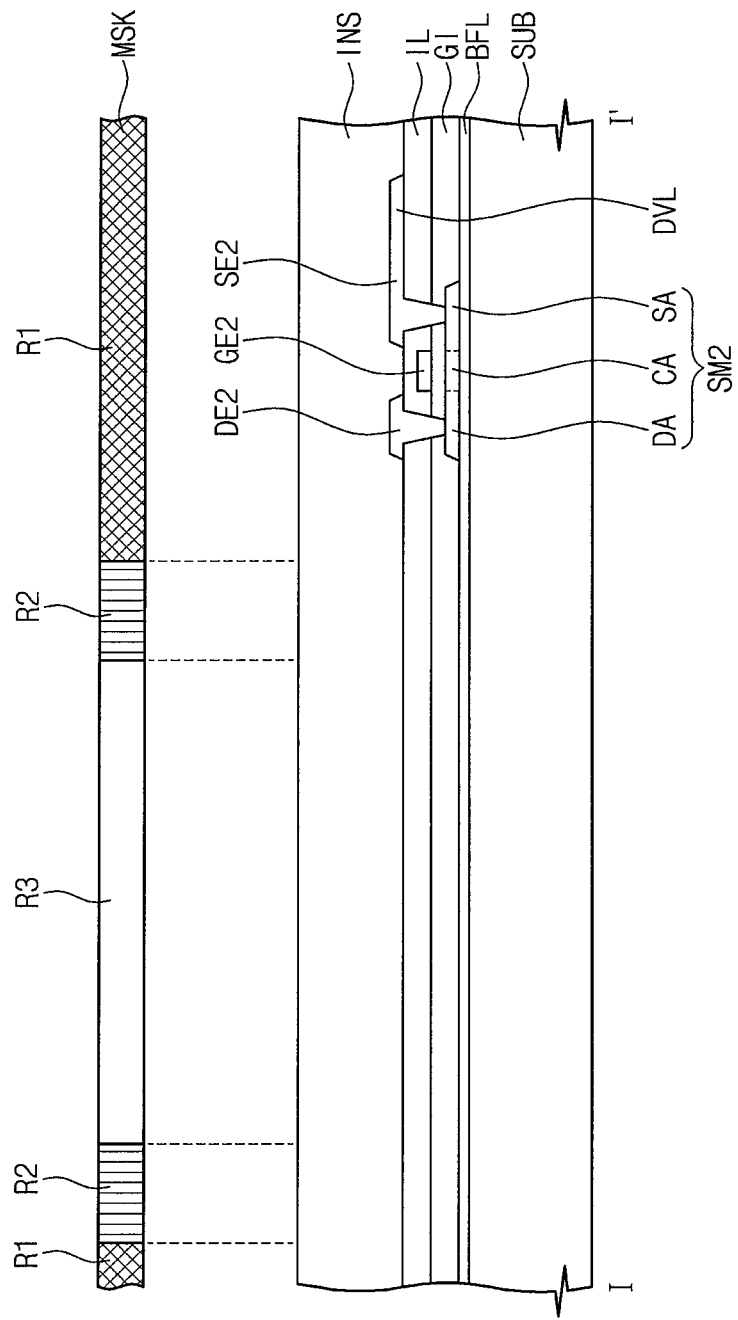

Referring to the embodiment illustrated in FIG. 4B, the insulating layer INS is exposed and developed using a mask MSK. The mask MSK, according to this embodiment, includes three regions respectively corresponding to the first, second, and third regions R1, R2, and R3, and thus the regions of the mask MSK are also referred to as first, second, and third regions R1, R2, and R3.

The mask MSK, in this embodiment, is a slit mask or a halftone mask and includes a first region R1 that blocks the light traveling thereto, a second region R2 including a slit pattern or a halftone pattern to transmit a portion of the light and block the other portion of the light, and a third region R3 that transmits the light traveling thereto.

Figure 4C:
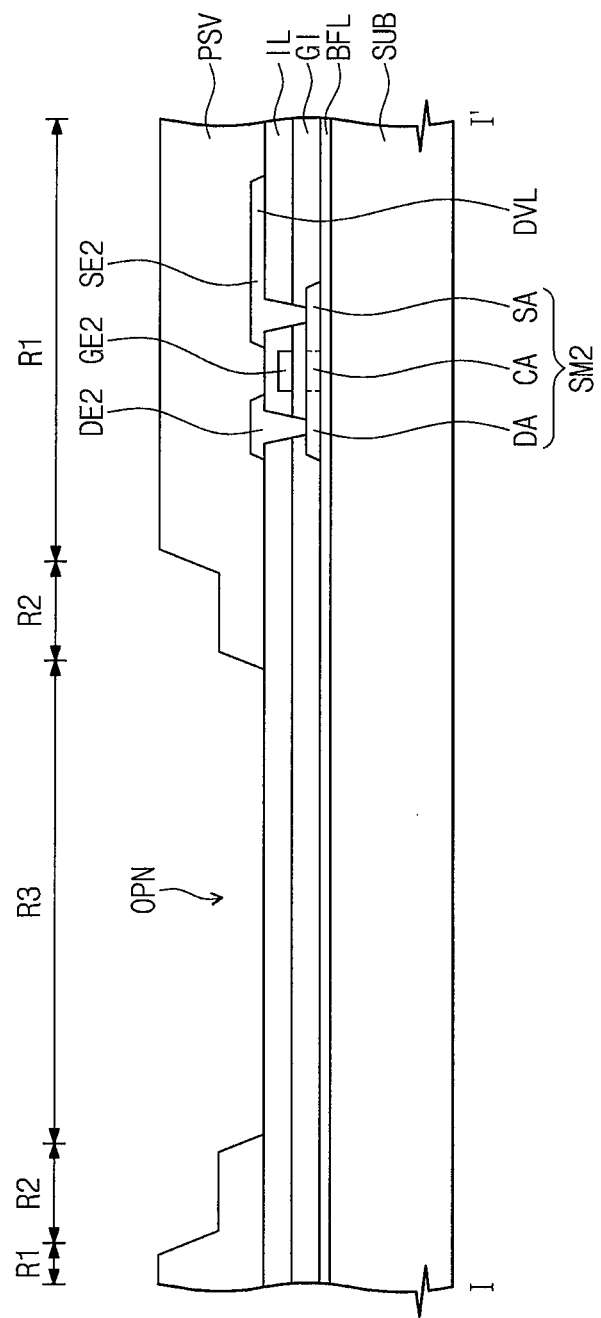

In this embodiment, once the insulating layer INS exposed to light through the mask MSK has been developed, the insulating layer INS remains in the first region R1 with a portion in the second region R2, the portion of the insulating layer INS in the second region R2 having a thickness less than that of the insulating layer INS in the first region R1, thereby forming the passivation layer PSV, as shown in FIG. 4C. The insulating layer INS is completely removed in the third region R3, thus defining an opening OPN through the passivation layer PSV, according to an embodiment.

In an embodiment, a thru-hole may be defined through the insulating layer INS in the first region R1 or the second region R2, and in this embodiment, the insulating layer INS corresponding to the thru-hole would be completely removed at the thru-hole. In an embodiment, the thru-hole may be defined in the first region R1 to expose an upper surface of the second drain electrode DE2.

In this embodiment, a positive photosensitive organic material, from which the exposed portion of the insulating layer INS is removed, is used as the insulating layer INS, but it should not be limited to the positive photosensitive organic material. According to another embodiment, a negative photosensitive organic material may be used as the insulating layer INS, such that a non-exposed portion of the insulating layer INS is removed.

In an embodiment, when the exposure process is performed on the passivation layer PSV, a portion of the light is irradiated onto the insulating layer INS of the second region R2, and the thickness of the passivation layer PSV of the second region R2 is adjusted by controlling the mask pattern.

For instance, in an embodiment where the mask is the slit mask, the width or the number of the slits SLT is adjusted to control the exposure amount of light traveling to the second region R2.

In an embodiment where the passivation layer PSV is formed of an inorganic insulating material, the passivation layer PSV is formed by forming a photoresist layer on an insulating layer, performing an exposure and development process on the insulating layer using a mask, and etching the insulating layer using the developed photoresist layer as a mask. In this embodiment, two or more masks are required to form the passivation layer PSV. However, in an embodiment where a diffraction mask or a halftone mask is used as the mask, the passivation layer PSV may be formed using one mask through an ashing process or an etch-back process.

In an embodiment where the insulating layer INS has a multi-layer structure, the passivation layer PSV is formed by individually patterning the layers or patterning the layers at once.

Figure 4D:
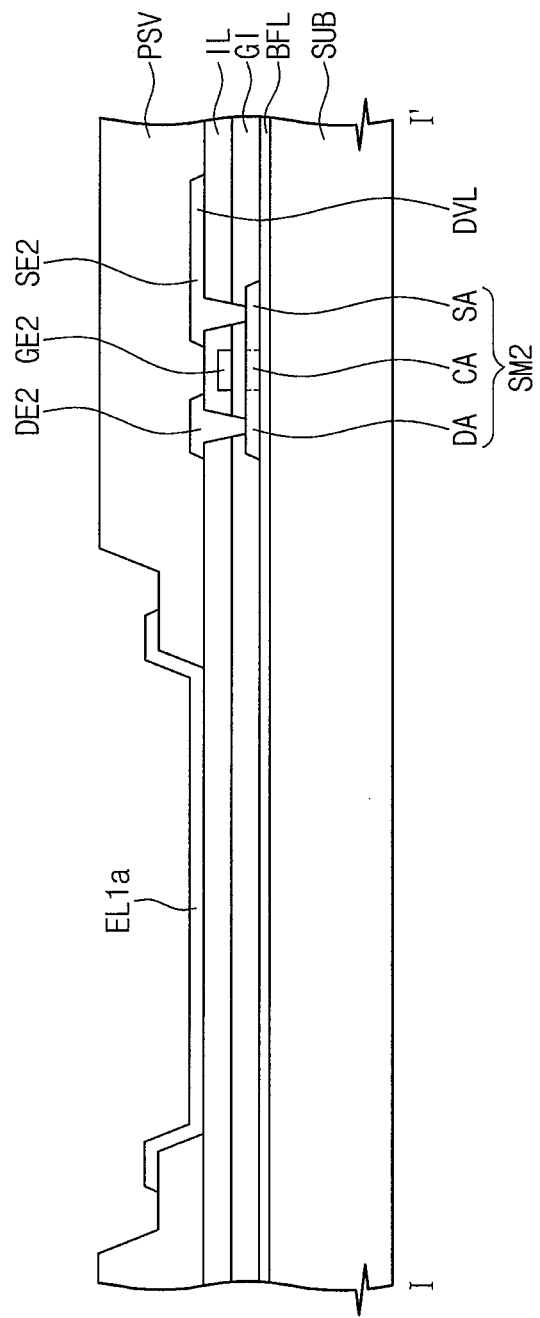

Referring to the embodiment illustrated FIG. 4D, the first electrode EL1 is formed on the passivation layer PSV.

The first electrode EL1, in this embodiment, is formed by depositing a conductive material on the passivation layer PSV and patterning the conductive material using a photolithography process. In this embodiment, the first electrode EL1 is formed by forming a conductive layer on the passivation layer PSV, forming a photosensitive organic layer, e.g., a photoresist layer, on the conductive layer, patterning the photosensitive organic layer using an exposure and development process, etching the conductive layer using the patterned photosensitive organic layer as a mask, and removing remaining photosensitive organic layer.

The first electrode EL1, according to an embodiment, includes the slit SLT defined therethrough to divide the first electrode EL1 into two or more sub-electrodes, e.g., EL1a and EL1b. In this embodiment, the first electrode EL1 includes the first sub-electrode EL1a and the second sub-electrode EL1b, which are defined by the slit SLT extending in the second direction D2.

In an embodiment, once the first electrode EL1 is formed, both ends of the slit SLT are in the second area R2. In this embodiment, when the first and second sub-electrodes EL1a and EL1b are adjacent to each other to form a quadrangular shape, vertexes at both ends of sides of the first and second sub-electrodes EL1a and EL1b facing each other are in the second area R2. Therefore, a portion of the first electrode EL1 is on the passivation layer PSV in the second area R2 and overlaps with the passivation layer PSV in the second area R2, according this embodiment, when viewed in a plan view.

Figure 4E:
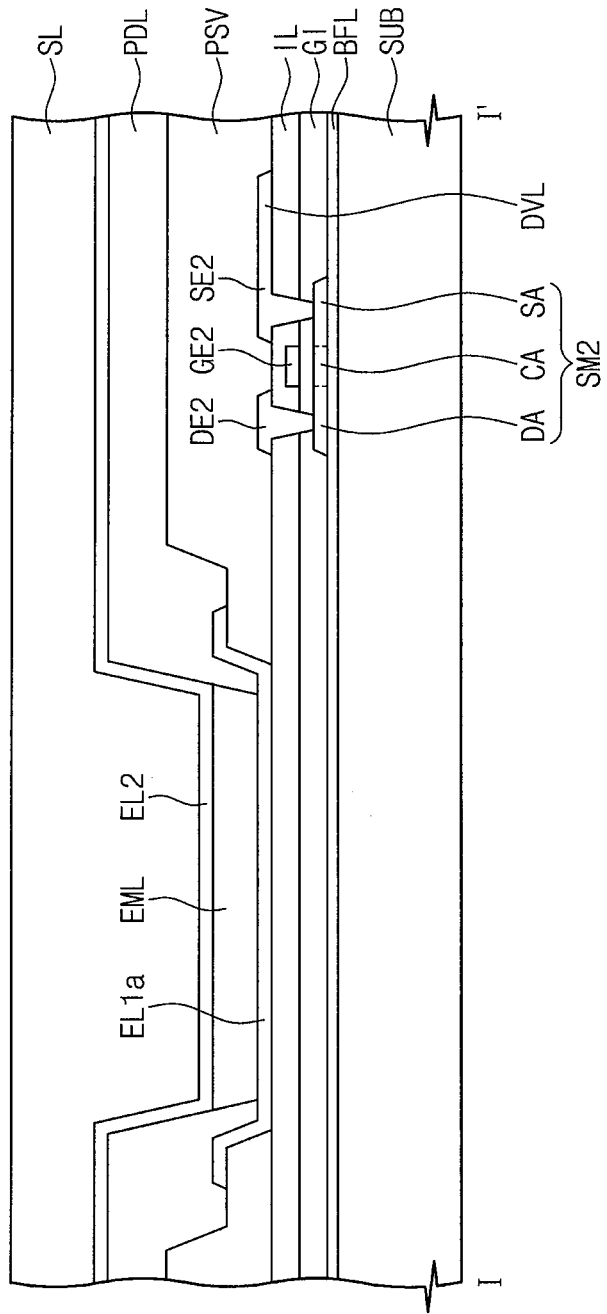

The pixel definition layer PDL, the light emitting layer EML, the second electrode EL2, and the sealing layer SL are sequentially formed on the substrate SUB on which the first electrode EL1 is formed, according to the embodiment illustrated in FIG. 4E.

The pixel definition layer PDL, in this embodiment, is formed by forming a photosensitive layer, patterning the photosensitive layer through a photolithography process, and curing the patterned photosensitive layer.

The light emitting layer EML, in this embodiment, is formed on the first electrode EL1. The light emitting layer EML may be on the substrate SUB in a fluid state through a printing method, a deposition method, or a thermal imaging method. The printing method, in this embodiment, includes an inkjet method and/or a coating method using a nozzle.

In an embodiment where the light emitting layer EML has a plurality of layers, each light emitting layer may be formed by a slit coating method, a printing method, a vacuum depositing method, a spin coating method, a casting method, and/or a Langmuir-Blodgett method.

In an embodiment, the second electrode EL2 is formed on the substrate SUB on which the light emitting layer EML is formed, and the sealing layer SL is formed to extend over the second electrode EL2, thereby manufacturing the display device.

In embodiments where the display device is manufactured according to the above-mentioned methods, the sub-electrodes of the first electrode EL1 may be prevented from being shorted-circuited.

In a conventional display device, the passivation layer may have a constant thickness except for an opening formed therethrough. In these conventional display devices, when the first electrode is formed on the passivation layer through a photolithography process, the first electrode is formed by forming a conductive layer on the passivation layer, forming a photosensitive organic layer, e.g., a photoresist layer, on the conductive layer, patterning the photosensitive organic layer using an exposure and development process, etching the conductive layer using the patterned photosensitive organic layer as a mask, and removing the remaining photosensitive organic layer.

However, due to a difference in height between the passivation layer and the inter-insulating layer in these conventional display devices, the photosensitive organic layer has a relatively larger thickness in an area in which the passivation layer and the inter-insulating layer are adjacent to each other than that of an area in which the passivation layer and the inter-insulating layer are not adjacent to each other. Therefore, a difference in thickness of the photosensitive organic layer occurs. Although the light is uniformly irradiated onto the entire area of the photosensitive organic layer in these conventional display devices, a portion of the photosensitive organic layer, which does not react with the light, is generated in the photosensitive organic layer having the relatively larger thickness, and, thus, the photosensitive organic layer remains in the area the passivation layer and the inter-insulating layer are positioned adjacent to each other after the development process is performed on the photosensitive organic layer. Since the remaining photosensitive organic layer exerts influence on the patterning process of the conductive layer, and the conductive layer remains in the area from which the conductive layer is required to be removed, a short-circuit or other defect may occur. In particular, the defect, in which the conductive layer is not removed, may be generated in the area in which the two sub-electrodes are positioned adjacent to each other, and, thus, the two sub-electrodes may be shorted-circuited, in these conventional display devices. When the two sub-electrodes are short-circuited, the two sub-electrodes may malfunction even though defects occur in only one sub-electrode, in these conventional display devices.

In an embodiment of the present invention, a thickness of the passivation layer is reduced in an area in which the difference in thickness between the inter-insulating layer IL and the passivation layer PV is large. Thus, the photosensitive organic layer may be prevented, from lacking exposure and the conductive layer may be appropriately removed.

Figure 5A:
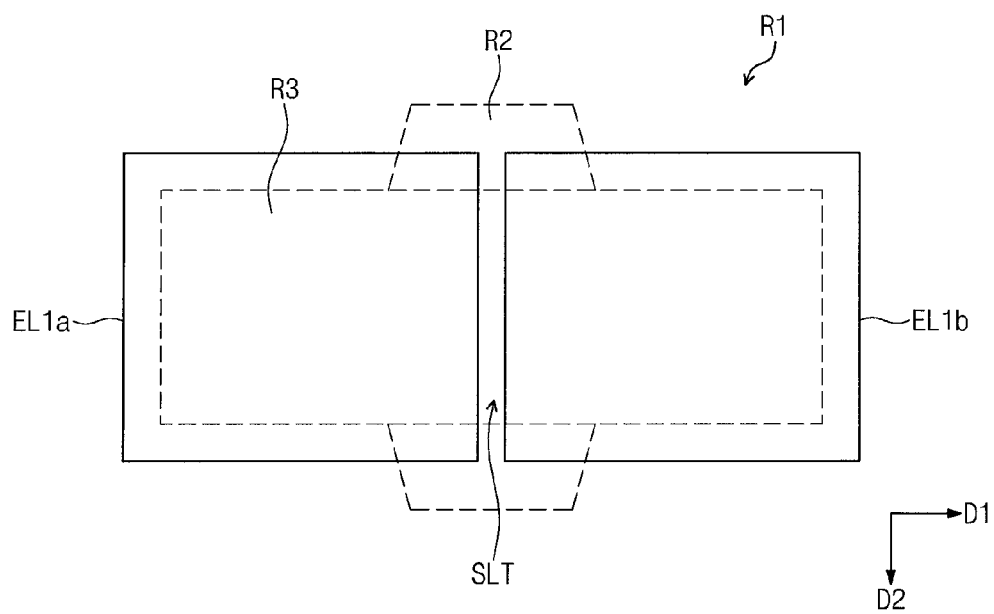
FIGS. 5A and 5B are plan views showing first, second, and third areas of a display device according to an embodiment of the present invention.
Figure 5B:
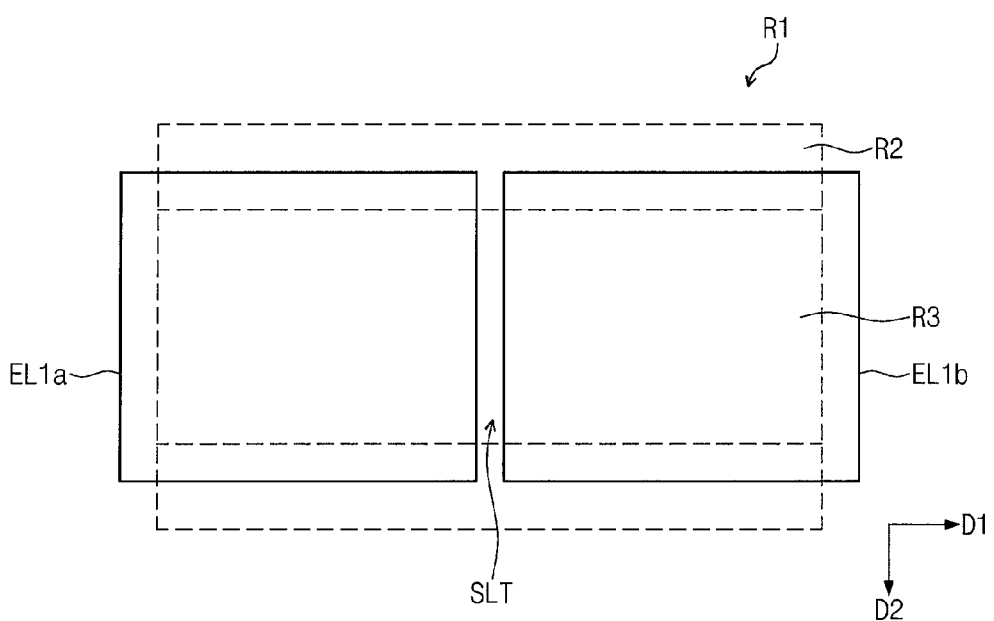
Figure 6A:
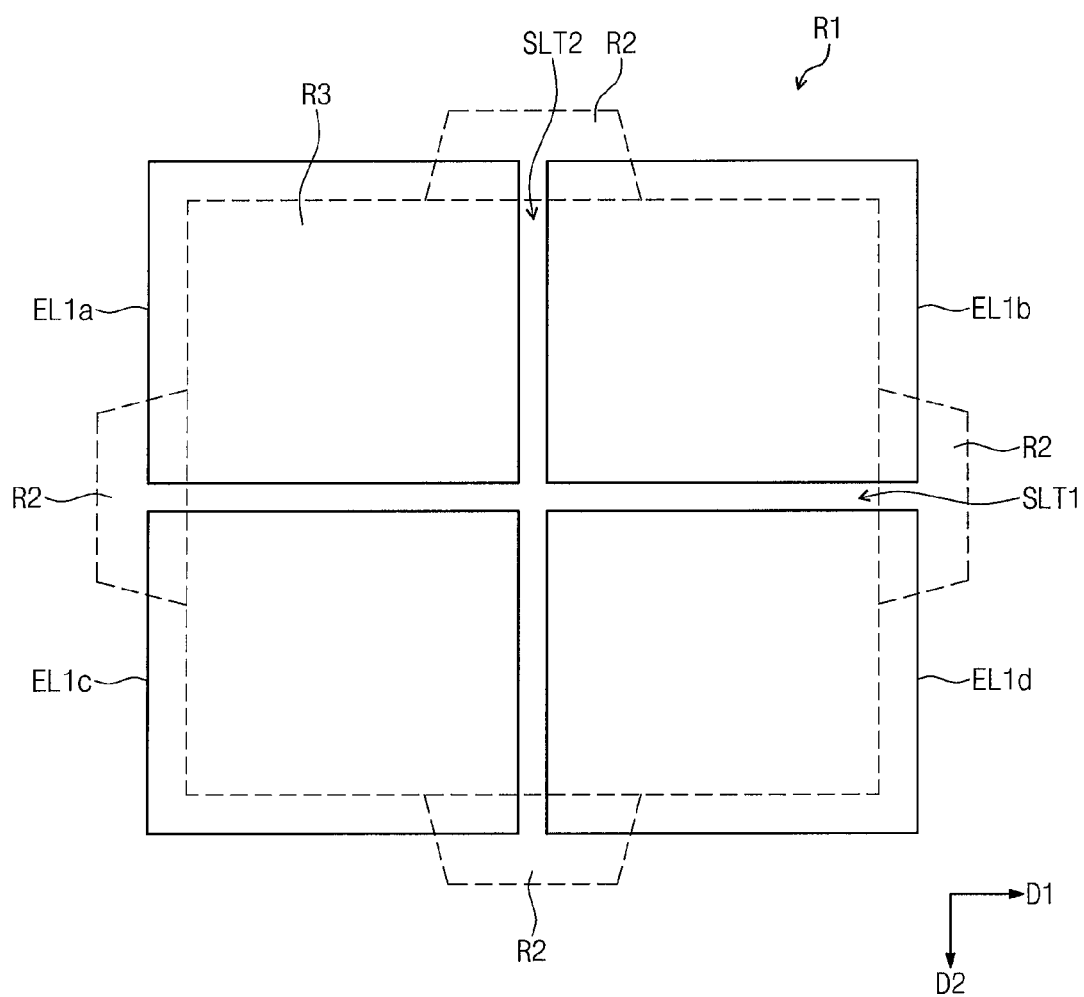
FIGS. 6A and 6B are plan views showing first, second, and third areas of a display device according to another embodiment of the present invention.
Figure 6B:
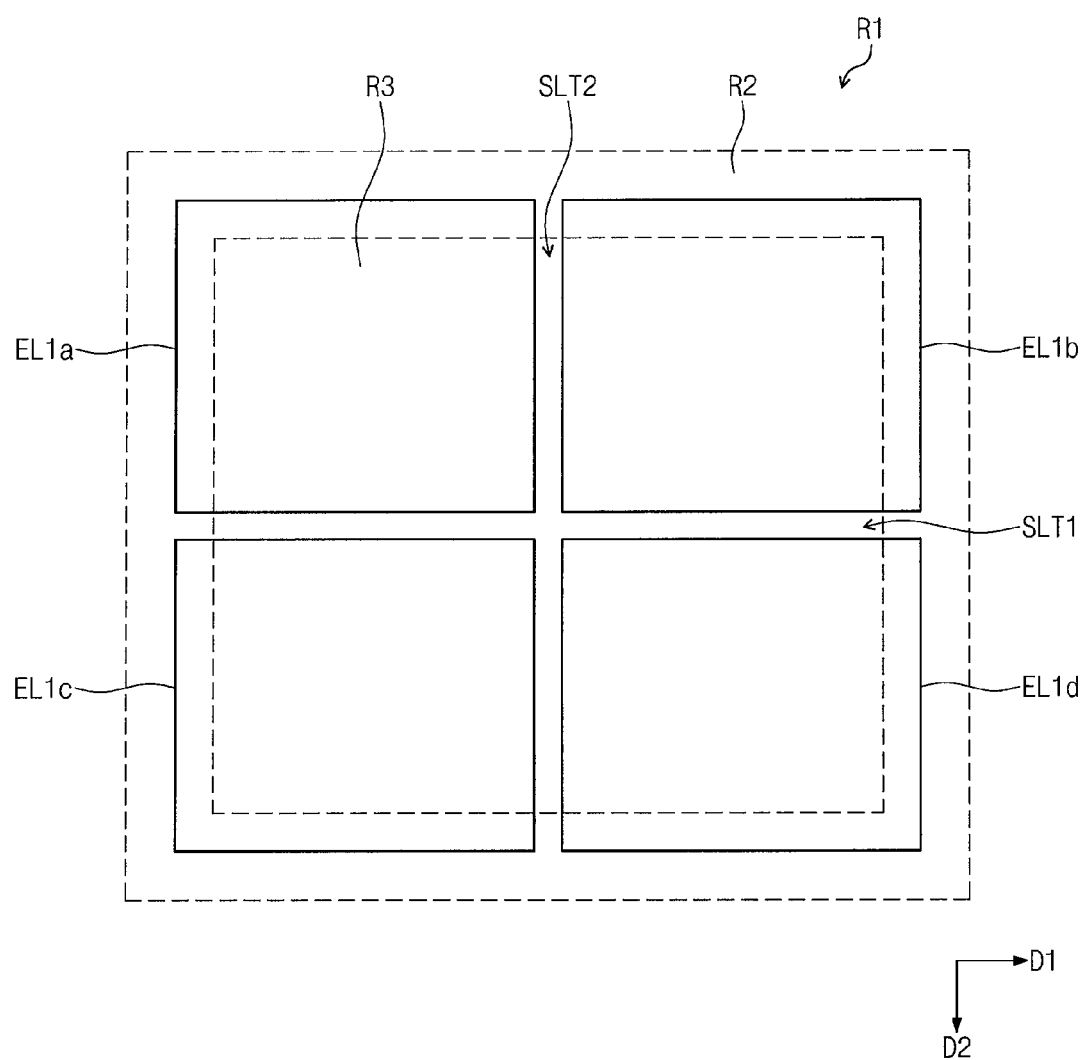

In this embodiment, the first, second, and third areas R1, R2, and R3 may have various shapes. FIGS. 5A and 5B are plan views showing first, second, and third areas of a display device according to an embodiment of the present invention. FIGS. 6A and 6B are plan views showing first, second, and third areas of a display device according to another embodiment of the present invention. FIGS. 5A and 5B show the first, second, and third areas R1, R2, and R3 in an embodiment where the first electrode EL1 includes the first and second sub-electrodes EL1a and EL1b, and FIGS. 6A and 6B show the first, second, and third areas R1, R2, and R3 in an embodiment where the first electrode EL1 includes first, second, third, and fourth sub-electrodes EL1a, EL1b, EL1c, and EL1d. For convenience of explanation, a connection portion between each sub-electrode EL1a, EL1b, EL1c, and/or EL1d and the thin film transistor has been omitted in FIGS. 5A, 5B, 6A, and 6B.

Referring to the embodiment illustrated in FIGS. 5A and 5B, the third area R3 has substantially the same shape as that of the display area DP. The shape of the display area DP, in these embodiments, varies depending on each pixel PXL. In this embodiment, the display area DP has a rectangular shape, as a representative example.

The second area R2, according to this embodiment, may have various shapes as long as the second area R2 overlaps with the both ends of the slit SLT when viewed in a plan view. For example, the second area R2, according to an embodiment, may have a quadrangular shape, e.g., a trapezoidal shape, as shown in FIG. 5A, or a rectangular shape, as shown in FIG. 5B. In this embodiment, one side of the rectangular shape or the trapezoidal shape matches a portion of one side of the third area R3, when viewed in a plan view. The vertexes at both ends of sides of the first and second sub-electrodes EL1a and EL1b facing each other are in the second area R2, according to this embodiment.

The second area R2 may correspond only with both ends of the slit SLT and the surrounding area of the vertexes of the first and second sub-electrodes EL1a and EL1b which face each other, as shown in FIG. 5A, but the second area R2, according to another embodiment, may also correspond with an area along the other sides of the first and second sub-electrodes EL1a and ED b.

Referring to the embodiments illustrated in FIGS. 6A and 6B, the third area R3 has substantially the same shape as that of the display area DP. The first electrode EL1, in this embodiment, includes the first sub-electrode EL1a through the fourth sub-electrode EL1d, which are spaced apart from each other by a first slit SLT1 extending in the first direction D1 and a second slit SLT2 extending in the second direction D2. The second area R2, in this embodiment, may have various shapes and may be at both ends of the first and second slits SLT1 and SLT2 when viewed in a plan view, and may overlap with both ends of each of the first and second slits SLT1 and SLT2.

In an embodiment, the second area R2 has a trapezoidal shape, as shown in FIG. 6A, or a ring shape corresponding to an outer perimeter of the first electrode EL1, as shown in FIG. 6B. The third area R3 is inside the ring shape corresponding to the outer perimeter of the first electrode EL1, in the embodiment shown in FIG. 6B. In these embodiments, one side of the trapezoidal shape matches a portion of one side of the third area R3, and an inner side or edge of the ring shape matches a side or outer edge of the third area R3.

FIGS. 5A, 5B, 6A, and 6B show the first electrode EL1 according to embodiments including two or four sub-electrodes, but the number of the sub-electrodes should not be limited thereto. Although the number of the sub-electrodes may vary, the second area R2 overlaps with both ends of the slit SLT that defines the sub-electrodes, and thus the sub-electrodes adjacent to each other may be prevented from short-circuiting, according to these embodiments.

Figure 7:
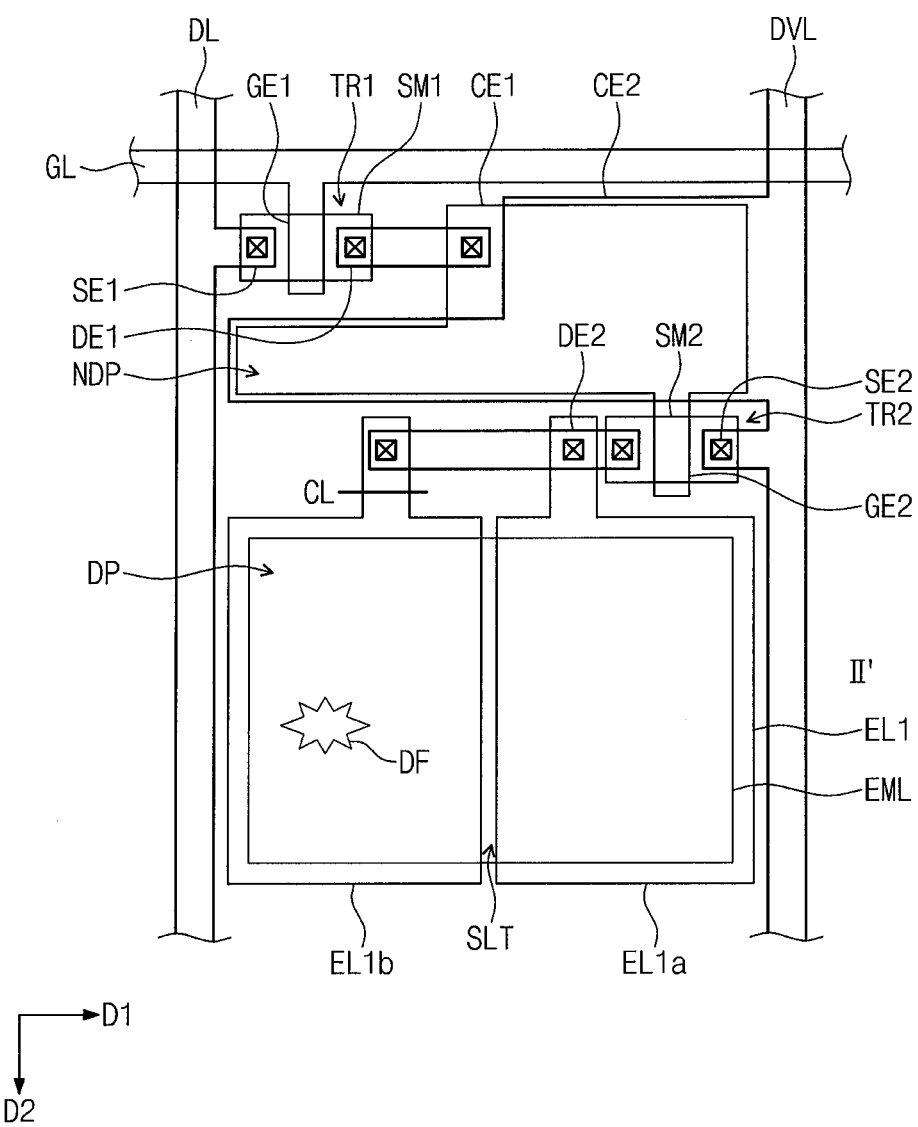
FIG. 7 is schematic a plan view illustrating a method for repairing a defect in a first electrode of a display device according to an embodiment of the present invention.

FIG. 7 is a schematic plan view illustrating a method for repairing a defect in a first electrode of a display device according to an embodiment of the present invention.

Referring to the embodiment illustrated in FIG. 7, the first electrode EL1 includes the first and second sub-electrodes EL1a and EL1b. According to this embodiment, when a defect DF, e.g., foreign substances, occurs in the first sub-electrode EL1a, the connection portion between the first sub-electrode EL1a and the second drain electrode DE2 of the driving thin film transistor TR2 is disconnected, for example, by using a laser beam. The disconnected portion between the first sub-electrode EL1a and the second drain electrode DE2 of the driving thin film transistor TR2, according to this embodiment, is indicated by a disconnection line CL.

In this embodiment, when the first sub-electrode EL1a, in which the defect DF occurs, is disconnected from the second drain electrode DE2, no image signal is applied to the first sub-electrode EL1a, and, thus, the first sub-electrode EL1a does not display an image. However, since the second sub-electrode EL1b, in this embodiment, is still connected or coupled to the second drain electrode DE2, the image signal is applied to the second sub-electrode EL1b, and, thus, the second sub-electrode EL1b can display the image. As a result, although the defect DF occurs in the portion of the first electrode EL1, i.e., in the first sub-electrode EL1a, the pixel PXL may be normally operated through this repair process (e.g., the disconnection line CL), resulting in the image being normally displayed despite the defect DF.

Although the embodiments of the present invention have been described above, it is to be understood that the present invention should not be limited to these embodiments, but various changes and modifications can be made by one of ordinary skilled in the art within the spirit and scope of the present invention, and as hereinafter claimed.

What is claimed is:

1. A display device comprising:
    a substrate;
    a passivation layer on the substrate, the passivation layer comprising an area having a first thickness and an area having a second thickness less than the first thickness;
    a first electrode on the passivation layer and comprising at least two sub-electrodes spaced apart from each other by a slit having two ends;
    a light emitting layer on the first electrode; and
    a second electrode on the light emitting layer,
    wherein both ends of the slit are in the area of the passivation layer having the second thickness.

2. The display device of claim 1,
    wherein the area having the first thickness is in a first area, and the area having the second thickness less than the first thickness is in a second area of the passivation layer, and
    wherein the passivation layer defines an opening in a third area, and both ends of the slit overlap the second area.

3. The display device of claim 2, wherein the substrate comprises a display area in which an image is configured to be displayed and a non-display area surrounding the display area in which no image is displayed, and wherein the third area of the passivation layer overlaps the display area.

4. The display device of claim 3, wherein the second area has a quadrangular shape and one side of the quadrangular shape of the second area matches a portion of one of the sides of the third area.

5. The display device of claim 1, wherein the passivation layer comprises an organic insulating material or an inorganic insulating material.

6. The display device of claim 5, wherein the passivation layer comprises a multi-layer structure.

7. The display device of claim 1, further comprising a thin film transistor between the substrate and the passivation layer to apply an image signal to each of the sub-electrodes.

8. The display device of claim 7, wherein at least one of the sub-electrodes is disconnected from the thin film transistor.

9. A method of manufacturing a display device, comprising:
- forming a passivation layer having a first area with a first thickness and a second area with a second thickness less than the first thickness on a substrate;
- forming a first electrode on the passivation layer, the first electrode comprising a plurality of sub-electrodes spaced apart from each other by a slit having two ends;
- forming a light emitting layer on the first electrode; and
- forming a second electrode on the organic light emitting layer, wherein both ends of the slit are in the second area of the passivation layer.

10. The method of claim 9, wherein the forming of the passivation layer comprises:
- forming an insulating layer on the substrate; and
- patterning the insulating layer to have the first thickness in the first area, the second thickness in the second area, and an opening in a third area.

11. The method of claim 10, wherein both ends of the slit overlap the second area.

12. The method of claim 11, wherein the patterning of the insulating layer comprises:
- forming a photosensitive organic material on the substrate;
- positioning a mask on the photosensitive organic material;
- exposing the photosensitive organic material through the mask; and
- developing the photosensitive organic material.

13. The method of claim 12, wherein the mask comprises a halftone mask or a diffraction mask.

14. The method of claim 13, wherein the photosensitive organic material comprises a positive type or a negative type photoresist.

15. The method of claim 14, wherein the photosensitive organic material comprises a positive type photoresist, and the mask blocks a light traveling to the photosensitive organic material in the first area, transmits a portion of the light and blocks the remaining portion of the light in the second area, and transmits the light in the third area.

16. The method of claim 10, wherein the substrate comprises a display area in which an image is configured to be displayed and a non-display area surrounding the display area, in which no image is displayed, and wherein the third area overlaps the display area.

17. The method of claim 16, wherein the second area has a quadrangular shape and one side of the quadrangular shape of the second area matches a portion of one of the sides of the third area.

18. The method of claim 17, further comprising forming a thin film transistor on the substrate before forming the passivation layer.

19. A method for repairing a display device, comprising:
- checking a sub-electrode in which a defect has occurred; and
- disconnecting the sub-electrode in which the defect has occurred from a thin film transistor of the display device;
- wherein the display device comprises
  - a substrate;
  - the thin film transistor on the substrate;
  - a passivation layer on the thin film transistor;
  - a first electrode on the passivation layer and comprising at least two sub-electrodes spaced apart from each other;
  - a light emitting layer on the first electrode; and
  - a second electrode on the light emitting layer.

20. The method of claim 19, wherein the sub-electrode in which the defect occurs is disconnected from the thin film transistor by a laser beam.

* * * * *